(12) United States Patent
Watakabe et al.

(10) Patent No.: US 12,166,131 B2
(45) Date of Patent: Dec. 10, 2024

(54) SEMICONDUCTOR DEVICE

(71) Applicant: Japan Display Inc., Tokyo (JP)

(72) Inventors: Hajime Watakabe, Tokyo (JP); Tomoyuki Ito, Tokyo (JP); Toshihide Jinnai, Tokyo (JP); Isao Suzumura, Tokyo (JP); Akihiro Hanada, Tokyo (JP); Ryo Onodera, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/328,788

(22) Filed: Jun. 5, 2023

(65) Prior Publication Data

US 2023/0317853 A1    Oct. 5, 2023

Related U.S. Application Data

(63) Continuation of application No. 17/499,908, filed on Oct. 13, 2021, now Pat. No. 11,721,765, which is a (Continued)

(30) Foreign Application Priority Data

Feb. 12, 2019 (JP) ................................. 2019-022378

(51) Int. Cl.
*H01L 27/12* (2006.01)
*H01L 21/02* (2006.01)
(Continued)

(52) U.S. Cl.
CPC .. *H01L 29/78627* (2013.01); *H01L 21/02178* (2013.01); *H01L 21/02565* (2013.01);
(Continued)

(58) Field of Classification Search
CPC ............... H01L 21/02178; H01L 21/02; H01L 21/02565; H01L 21/426; H01L 21/47573; H01L 21/4757; H01L 21/47635; H01L 21/4763; H01L 27/1225; H01L 27/12; H01L 27/124; H01L 27/1251; H01L 27/127; H01L 29/78627; H01L 29/786;
(Continued)

(56) References Cited

U.S. PATENT DOCUMENTS 7,692,194 B2 * 4/2010 Yamazaki ......... H01L 29/78621
257/E29.117
9,240,488 B2 * 1/2016 Yamazaki ........... H01L 29/7869
(Continued)

*Primary Examiner* — Nikolay K Yushin
(74) *Attorney, Agent, or Firm* — XSENSUS LLP

(57) ABSTRACT

A semiconductor device includes thin film transistors each having an oxide semiconductor. The oxide semiconductor has a channel region, a drain region, a source region, and low concentration regions which are lower in impurity concentration than the drain region and the source region. The low concentration regions are located between the channel region and the drain region, and between the channel region and the source region. Each of the thin film transistors has a gate insulating film on the channel region and the low concentration regions, an aluminum oxide film on a first part of the gate insulating film, the first part being located on the channel region, and a gate electrode on the aluminum oxide film and a second part of the gate insulating film, the second part being located on the low concentration regions.

20 Claims, 15 Drawing Sheets

Related U.S. Application Data continuation of application No. 16/785,662, filed on Feb. 10, 2020, now Pat. No. 11,177,388.

(51) Int. Cl.

| | |
|---|---|
| *H01L 21/426* | (2006.01) |
| *H01L 21/4757* | (2006.01) |
| *H01L 21/4763* | (2006.01) |
| *H01L 29/24* | (2006.01) |
| *H01L 29/423* | (2006.01) |
| *H01L 29/49* | (2006.01) |
| *H01L 29/66* | (2006.01) |
| *H01L 29/786* | (2006.01) |
| *G02F 1/1368* | (2006.01) |

(52) U.S. Cl.
CPC ...... *H01L 21/426* (2013.01); *H01L 21/47573* (2013.01); *H01L 21/47635* (2013.01); *H01L 27/1225* (2013.01); *H01L 27/124* (2013.01); *H01L 27/1251* (2013.01); *H01L 27/127* (2013.01); *H01L 29/24* (2013.01); *H01L 29/42384* (2013.01); *H01L 29/4908* (2013.01); *H01L 29/66969* (2013.01); *H01L 29/78633* (2013.01); *H01L 29/78675* (2013.01); *H01L 29/7869* (2013.01); *G02F 1/1368* (2013.01); *H01L 2029/42388* (2013.01)

(58) Field of Classification Search
CPC ......... H01L 29/24; H01L 29/16; H01L 29/18; H01L 29/20; H01L 29/22; H01L 29/4238; H01L 29/423; H01L 29/4908; H01L 29/49; H01L 29/66969; H01L 29/78633; H01L 29/78675; H01L 29/7869; H01L 29/78621; H01L 2029/42388; H01L 21/02365; H01L 23/52; H01L 23/5226; H01L 23/48; H01L 23/645; H01L 29/42384; H01L 29/66; H01L 2029/7863; H01L 2029/7858; G02F 1/1368; G02F 1/155; G02F 1/13338; G02F 1/136227; G02F 1/133345; G02F 1/13793

See application file for complete search history.

(56) References Cited

U.S. PATENT DOCUMENTS

| | | | | |
|---|---|---|---|---|
| 10,249,647 | B2* | 4/2019 | Yamazaki | G11C 19/28 |
| 10,276,722 | B2* | 4/2019 | Yoshitani | H01L 29/512 |
| 10,361,260 | B2* | 7/2019 | Kim | H10K 59/1216 |
| 2008/0179675 | A1* | 7/2008 | Yamazaki | H01L 29/66757 |
| | | | | 257/E29.151 |
| 2011/0147738 | A1* | 6/2011 | Yamazaki | H01L 21/425 |
| | | | | 257/43 |
| 2015/0333089 | A1* | 11/2015 | Yamazaki | H01L 29/42372 |
| | | | | 257/43 |
| 2017/0278974 | A1* | 9/2017 | Yoshitani | H01L 29/518 |
| 2018/0083084 | A1* | 3/2018 | Kim | H01L 27/1248 |

* cited by examiner

SEMICONDUCTOR DEVICE

CROSS-REFERENCE TO RELATED APPLICATIONS

This application is a continuation of U.S. application Ser. No. 17/499,908, filed Oct. 13, 2021, which is a continuation of U.S. application Ser. No. 16/785,662, filed Feb. 10, 2020 (now U.S. Pat. No. 11,177,388), which claims priority from Japanese Patent Application JP 2019-022378 filed on Feb. 12, 2019, the contents of each are hereby incorporated by reference into this application.

BACKGROUND OF THE INVENTION

The present invention relates to a semiconductor device and a method of manufacturing the semiconductor device and, in particular, relates to the semiconductor device which has a thin film transistor (TFT) using an oxide semiconductor and so forth and is used in a display apparatus and to the method of manufacturing the semiconductor device.

A liquid crystal display apparatus has a configuration that a TFT substrate that pixels each of which has a pixel electrode, the thin film transistor and so forth are formed in a matrix and a counter substrate are arranged so as to face each other and a liquid crystal is interposed and held between the TFT substrate and the counter substrate. Then, an image is formed by controlling transmittance of light which depends on the orientation of liquid crystal molecules pixel by pixel.

The TFT which uses the oxide semiconductor is low in leakage current and therefore is preferable as a switching TFT for use in a pixel region.

It is necessary for the switching TFT for use in the pixel region to be low in leakage current. On the other hand, the switching TFT for use in the pixel region is requested to be large in ON current. That is, it is necessary for the TFT which uses the oxide semiconductor to maintain a sufficiently high resistance in a channel region and to be sufficiently low in resistance in a source region and a drain region.

On the other hand, even in the TFT which uses the oxide semiconductor, there are cases where, in the TFT which is short in gate length, drain deterioration occurs due to presence of a high drain electric field. An LDD (Lightly Doped Drain) structure which has a low concentration impurity region which is lower in impurity concentration than the drain region on an end of the drain region is known as measures against the drain deterioration.

There exists Japanese Unexamined Patent Application Publication No. 2007-200936 as a proposal relating the thin film transistor having the LDD structure.

SUMMARY OF THE INVENTION

There is a gate overlapped LDD (Gate Overlapped Lightly Doped Drain: GOLD) structure as one of the LDD structures. The inventers and others of the present invention have examined adoption of the GOLD structure in the thin film transistor which uses the oxide semiconductor. As a result of examination, the inventers and others of the present invention have noticed that a technology of forming the thin film transistor having the GOLD structure without increasing the number of manufacturing steps is requested.

The present invention aims to provide a technology of making it possible to form the thin film transistor having the GOLD structure without increasing the number of the manufacturing steps in the thin film transistor which uses the oxide semiconductor.

Other subjects and novel features of the present invention will become apparent from description of the present specification and the appended drawings.

Summary of representative characteristics of the present invention will be briefly described as follows.

A semiconductor device comprises thin film transistors each having an oxide semiconductor. The oxide semiconductor has a channel region, a drain region, a source region, and low concentration regions which are lower in impurity concentration than the drain region and the source region, the low concentration regions being located between the channel region and the drain region, and between the channel region and the source region. Each of the thin film transistors has a gate insulating film on the channel region and the low concentration regions, an aluminum oxide film on a first part of the gate insulating film, the first part being located on the channel region, and a gate electrode on the aluminum oxide film and a second part of the gate insulating film, the second part being located on the low concentration regions.

A semiconductor device comprises a substrate, first thin film transistors each being on the substrate and having polycrystalline silicon, and second thin film transistors each being on the substrate and having an oxide semiconductor. The oxide semiconductor has a channel region, a drain region, a source region, and low concentration regions which are lower in impurity concentration than the drain region and the source region, the low concentration regions being located between the channel region and the drain region, and between the channel region and the source region. Each of the second thin film transistors has a gate insulating film on the channel region and the low concentration regions, an aluminum oxide film on a first part of the gate insulating film, the first part being located on the channel region, and a gate electrode on the aluminum oxide film and a second part of the gate insulating film, the second part being located on the low concentration regions.

A method of manufacturing a semiconductor device with a thin film transistor having an oxide semiconductor which includes a channel region, a drain region, a source region, and low concentration regions which are lower in impurity concentration than the drain region and the source region, the low concentration regions being located between the channel region and the drain region, and between the channel region and the source region, comprises steps of selectively forming a semiconductor layer of the thin film transistor on a substrate, forming a gate insulating film so as to cover the semiconductor layer, forming an aluminum oxide film on the gate insulating film so as to make resistance of the semiconductor layer high with oxygen, selectively patterning the aluminum oxide film so as to be locate on the channel region, forming a gate electrode on the gate insulating film and on the aluminum oxide film selectively patterned and thereby making the gate electrode suck up the oxygen in the drain region, the source region, and the low concentration regions, selectively patterning the gate electrode so as to be located on the aluminum oxide film selectively patterned and on the low concentration regions, and performing ion implantation by using the gate electrode electively patterned as a mask and thereby imparting electroconductivity to the drain region and the source region.

DETAILED DESCRIPTION OF THE PREFERRED EMBODIMENTS

Figure 1:
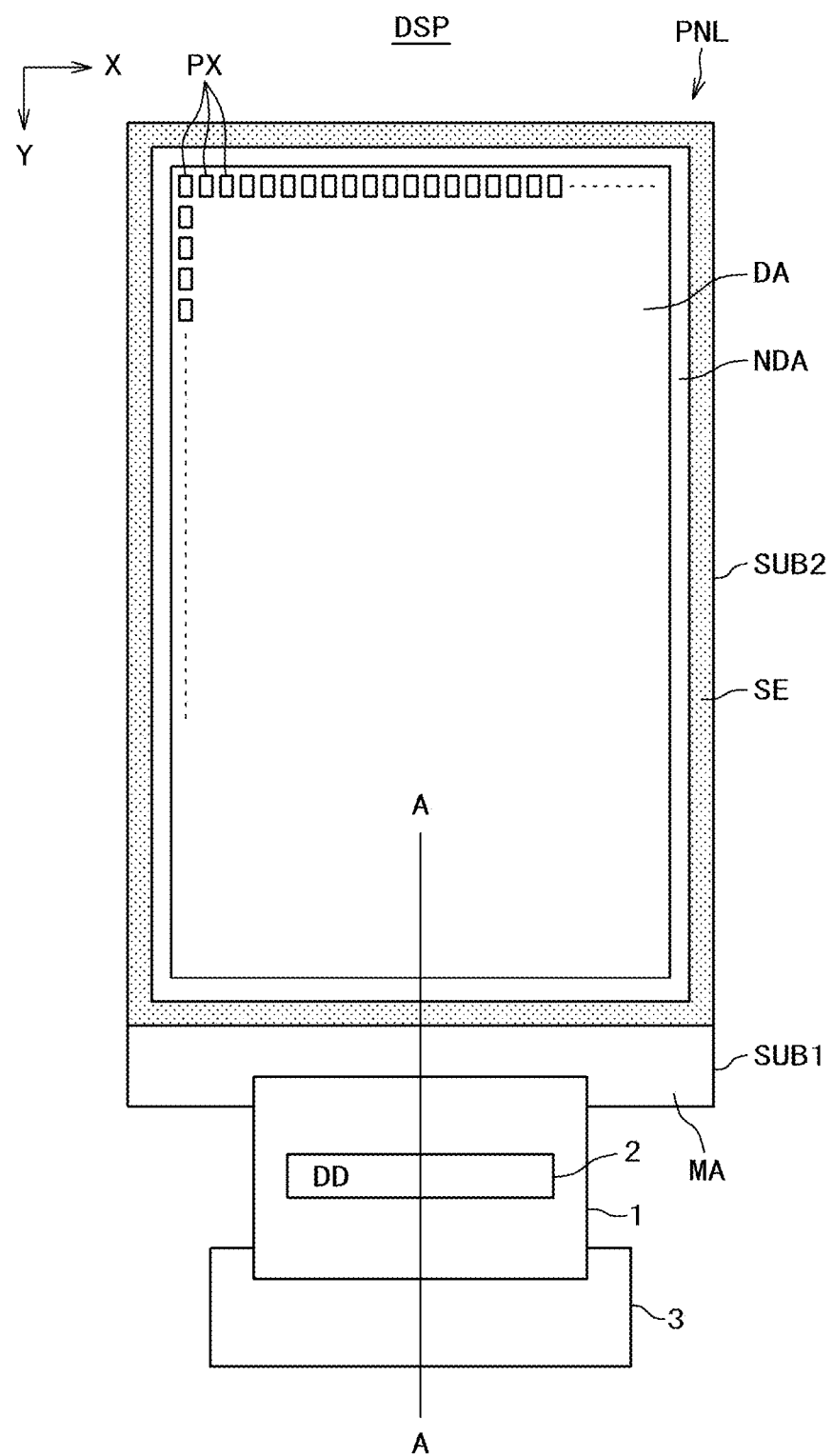
FIG. 1 is a plan view illustrating one example of an external appearance of a display apparatus according to one embodiment of the present invention.

In the following, one embodiment of the present invention and a modified example thereof will be described with reference to the drawings.

Incidentally, a matter which is disclosed here is just one example and a matter appropriate modification of which is readily conceivable for a person skilled in the art while maintaining the gist of the present invention falls within the scope of the present invention. In addition, although there are cases where in the drawings, a width, a thickness, a shape and so forth of each part are schematically illustrated in comparison with those in an actual situation for more clarification of description, schematic illustration thereof is just one example and does not restrict interpretation of the present invention. In addition, in the present specification and the respective drawings, there are cases where the same symbol is assigned to an element which is the same as the element which is described before in relation to the drawing which has been already referred to and detailed description thereof is appropriately omitted.

In the embodiment and the modified example thereof, a liquid crystal display apparatus will be disclosed as one example of the display apparatus. It is possible to use this liquid crystal display apparatus in various kinds of equipment such as, for example, a smartphone, a tablet terminal, a cellular phone handset, a personal computer, a TV receiver, in-vehicle equipment, a gaming machine and so forth.

Incidentally, in the present specification and the claims, expressions such as "up", "down" and so forth which are used for description of the drawings express a relative positional relation between a target structure and another structure. Specifically, in a case of viewing the structures from the side face, a direction from a first substrate (an array substrate) toward a second substrate (a counter substrate) is defined as "up" and an opposite direction is defined as "down".

In addition, "inside" and "outside" indicate a relative positional relation between two parts with a display area being set as a standard. That is, "inside" indicates the side which is close to the display area relative to one part and "outside" indicates the side which is far from the display area relative to one part. However, here, it is to be understood that the definition of "inside" and "outside" is settled in a case where the liquid crystal display apparatus is not in a bent state.

The "display apparatus" indicates a general display apparatus which displays a video by using a display panel. The "display panel" indicates a structure which displays the video by using an electrooptic layer. For example, there are also cases where the term "display panel" indicates a display cell which includes the electrooptic layer and there are also cases where the term "display panel" indicates a structure that another optical member (for example, a polarizing member, a backlight, a touch panel and so forth) is mounted on the display cell. A liquid crystal layer, an electro-chromic (EC) layer and so forth may be included in the "electrooptic layer" as long as any technical contradiction does not occur. Accordingly, although description will be made by exemplifying a liquid crystal panel which includes the liquid crystal layer as the display panel in regard to the embodiment and the modified example which will be described later, it does not mean that application of the present invention to the display panel which includes an electrooptic layer other than the abovementioned electrooptic layers is excluded.

EMBODIMENT (Overall Configuration Example of Display Apparatus)

Figure 2:
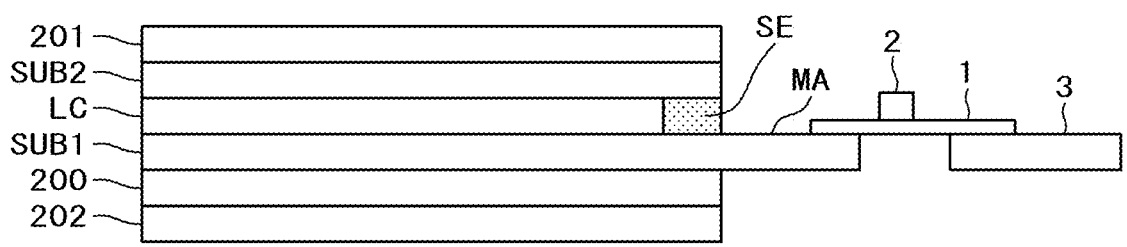
FIG. 2 is a sectional diagram taken along the A-A line in FIG. 1.

FIG. 1 is a plan view illustrating one example of an external appearance of a display apparatus according to one embodiment of the present invention. FIG. 2 is a sectional diagram taken along the A-A line in FIG. 1.

In FIG. 1 and FIG. 2, a display apparatus DSP includes a display panel PNL, a flexible printed circuit board 1, an IC chip 2 and a circuit board 3. The display panel PNL is a liquid crystal display panel and includes a first substrate (also called a TFT substrate or an array substrate) SUB1, a second substrate (also called a counter substrate) SUB2, a liquid crystal layer LC, and a seal SE.

The display panel PNL includes a display section (a display area) DA which displays an image and a frame-shaped non-display section (non-display area) NDA which surrounds an outer periphery of the display section DA. The second substrate SUB2 confronts the first substrate SUB1. The first substrate SUB1 has a mounting area MA which extends in a second direction Y beyond the second substrate SUB2. The seal SE is located on the non-display section NDA, bonds the first substrate SUB1 and the second substrate SUB2 together and seals the liquid crystal layer LC.

In FIG. 2, a lower polarizing plate 200 is stuck to the lower side of the first substrate SUB1 and an upper polarizing plate 201 is stuck to the upper side of the second substrate SUB2. A combination of the first substrate SUB1, the second substrate SUB2, the lower polarizing plate 200, the upper polarizing plate 201, and the liquid crystal layer LC is called the display panel PNL. Since the display panel PNL itself does not emit light, a backlight 202 is installed on a back face thereof.

A plurality of external terminals are formed on the mounting section MA. The flexible wiring board (that is, the flexible printed circuit board) 1 is connected to the plurality of external terminals of the mounting section MA. A driver IC2 which supplies a video signal and so forth is loaded on the flexible wiring board 1. The circuit board 3 which is adapted to supply signals and electric power to the driver IC2 and the display apparatus DSP from the outside is connected to the flexible wiring board 1. Incidentally, the IC chip 2 may be mounted on the mounting section MA. The IC chip 2 contains therein a display diver DD which outputs a signal which is necessary for image display in a display mode in which an image is displayed.

As illustrated in FIG. 1, a plurality of pixels PX are formed in a matrix in the display area DA and each pixel PX has a thin film transistor (TFT) as a switching element. A drive circuit which is adapted to control and drive a scan line, a video signal line and so forth is formed in the non-display area NDA. The drive circuit has the thin film transistor (TFT).

It is necessary for TFT which is used as the switching element of each pixel to be reduced in leakage current. TFT which is configured by the oxide semiconductor is capable of reducing the leakage current. Hereinafter, the oxide semiconductor will be called OS (Oxide Semiconductor). OS includes IGZO (Indium Gallium Zinc Oxide), ITZO (Indium Tin Zinc Oxide), ZnON (Zinc Oxide Nitride), IGO (Indium Gallium Oxide) and so forth. Hereinafter, description will be made with the oxide semiconductor being represented by OS. Since OS is low in carrier mobility, there are cases where it is difficult to form the drive circuit to be built in the display apparatus DSP with TFT which uses OS. Hereinafter, the term "OS" will be used also as a meaning of TFT which uses OS.

On the other hand, LTPS (Low Temperature Poly-Si) is high in carrier mobility and therefore is suitable as TFT which configures the drive circuit. Since in the liquid crystal display apparatus, LTPS is used as polycrystalline silicon or polycrystallity silicon (Poly-Si) in many cases, "poly-Si" will also be called "LTPS" in the following. Since TFT which is made of LTPS is high in carrier mobility, it is possible to form the drive circuit by using the thin film transistor (TFT) which uses LTPS. LTPS will also be used as a meaning of TFT which uses LTPS hereinafter.

That is, since it is necessary for the thin film transistor (TFT) which is used for the pixel PX to be reduced in leakage current, it is rational to use the oxide semiconductor (OS). Since it is necessary for the thin film transistor (TFT) which is used in the drive circuit to be high in carrier mobility, it is rational to LTPS.

However, since there are cases where designing is possible even with the carrier mobility of amorphous silicon (a-Si) and the OS depending on an applicable product, the configuration of the present invention is effective also in a case of using a-Si and OS in the drive circuit.

The display panel PNL of the present embodiment may be any of a transmissive type display panel which has a transmissive display function of displaying the image by allowing light which is sent from the back-face side of the first substrate SUB1 to selectively pass through the display panel, a reflective type display panel which has a reflective display function of displaying the image by selectively reflecting light which is sent from the front-face side of the second substrate SUB2 and a semi-transmissive type display panel which has both the transmissive display function and the reflective display function.

In addition, although description of a detailed configuration of the display panel PNL is omitted here, the display panel PNL may also have any configuration which copes with a display mode in which a lateral electric field is utilized, a display mode in which a longitudinal electric field which is generated along a normal line of a substrate main face is utilized, a display mode in which an inclined electric field which is diagonally inclined relative to the substrate main face is utilized and further a display mode in which the abovementioned lateral electric field, longitudinal electric field, and inclined electric field are utilized by appropriately combining these electric fields with one another. Here, the substrate main face is a face which is parallel with an X-Y plane which is defined by a first direction X and the second direction Y.

(Circuit Configuration Example of Display Apparatus)

Figure 3:
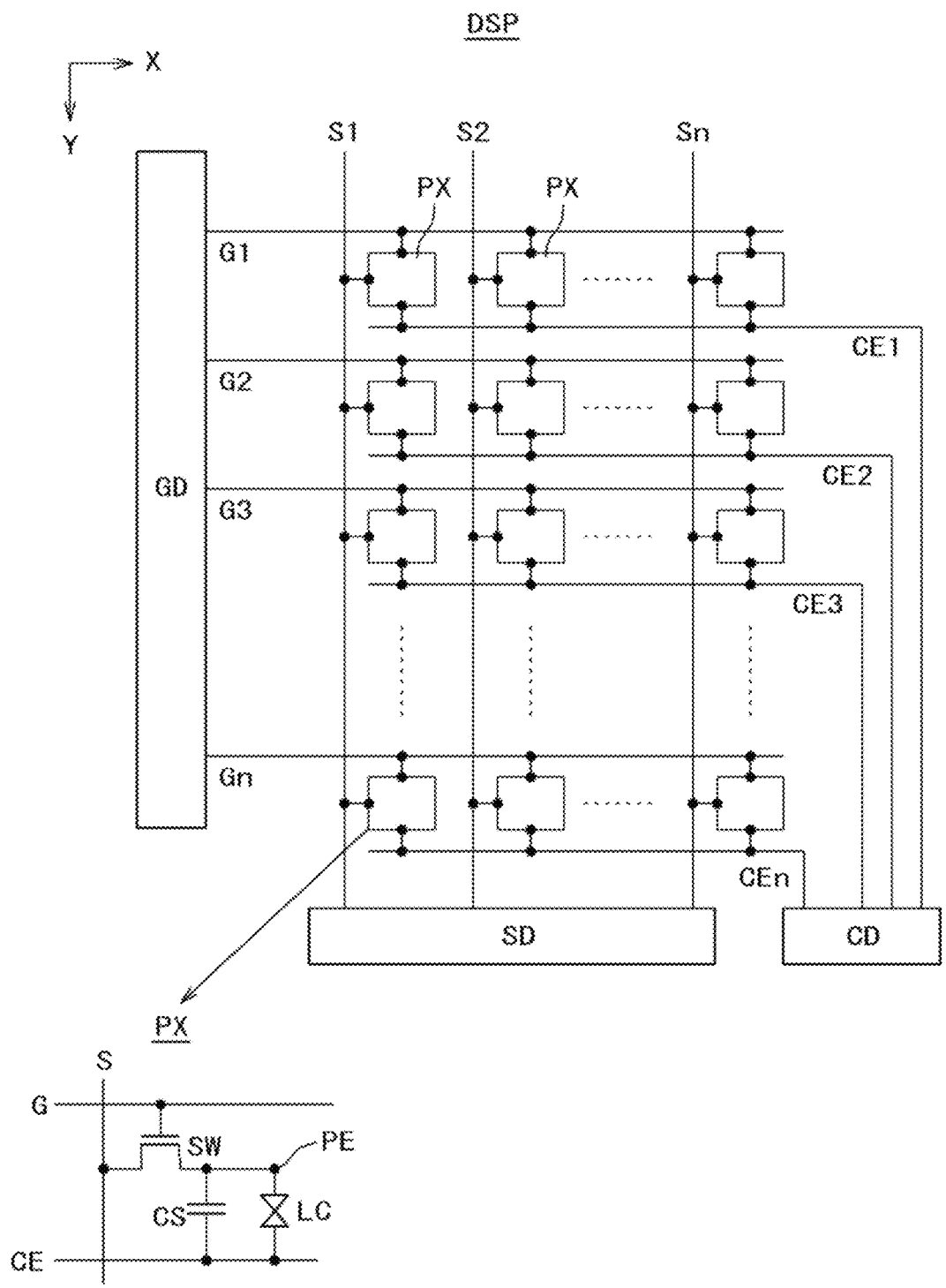
FIG. 3 is a diagram illustrating examples of a basic configuration of a pixel PX and an equivalent circuit of the display apparatus.

FIG. 3 is a diagram illustrating examples of a basic configuration of the pixel PX and an equivalent circuit of the display apparatus DSP. The plurality of pixels PX are arranged in a matrix in the first direction X and the second direction Y. A plurality of scan lines G (G1, G2, . . . ) are connected to a scan line drive circuit GD. A plurality of signal lines S (S1, S2, . . . ) are connected to a signal line drive circuit SD. A plurality of common electrode CE (CE1, CE2, . . . ) are connected to a voltage supply unit CD which supplies a common voltage (Vcom) and are arranged over the plurality of pixels PX. One pixel PX is connected to one scan line G, one signal line S and one common electrode CE. Incidentally, the scan line G and the signal line S may not necessarily extend linearly and may be partially bent. For example, even in a case where the signal line S is partially bent, it is regarded that the signal line S extends in the second direction Y. The scan line drive circuit GD, the signal line drive circuit SD and the voltage supply unit CD are configured by thin film transistors (TFTs) respectively.

Each pixel PX includes a switching element SW, a pixel electrode PE, the common electrode CE, the liquid crystal layer LC and so forth. The switching element SW is configured by, for example, a thin film transistor (TFT) and is electrically connected with the scan line G and the signal line S. The scan line G is connected with the switching elements SW of the respective pixels PX which are arrayed in the first direction X. The signal line S is connected with the switching elements SW of the respective pixels PX which are arrayed in the second direction Y. The pixel electrode PE is electrically connected with the switching element SW. Each of the pixel electrodes PE confronts the common electrode CE and drives the liquid crystal layer CL with an electric field which is generated between the pixel electrode PE and the common electrode CE. A holding capacitor CS is formed, for example, between an electrode which is the same as the common electrode CE in potential and an electrode which is the same as the pixel electrode PE in potential.

(Configuration Example of Thin Film Transistor)

Figure 4:
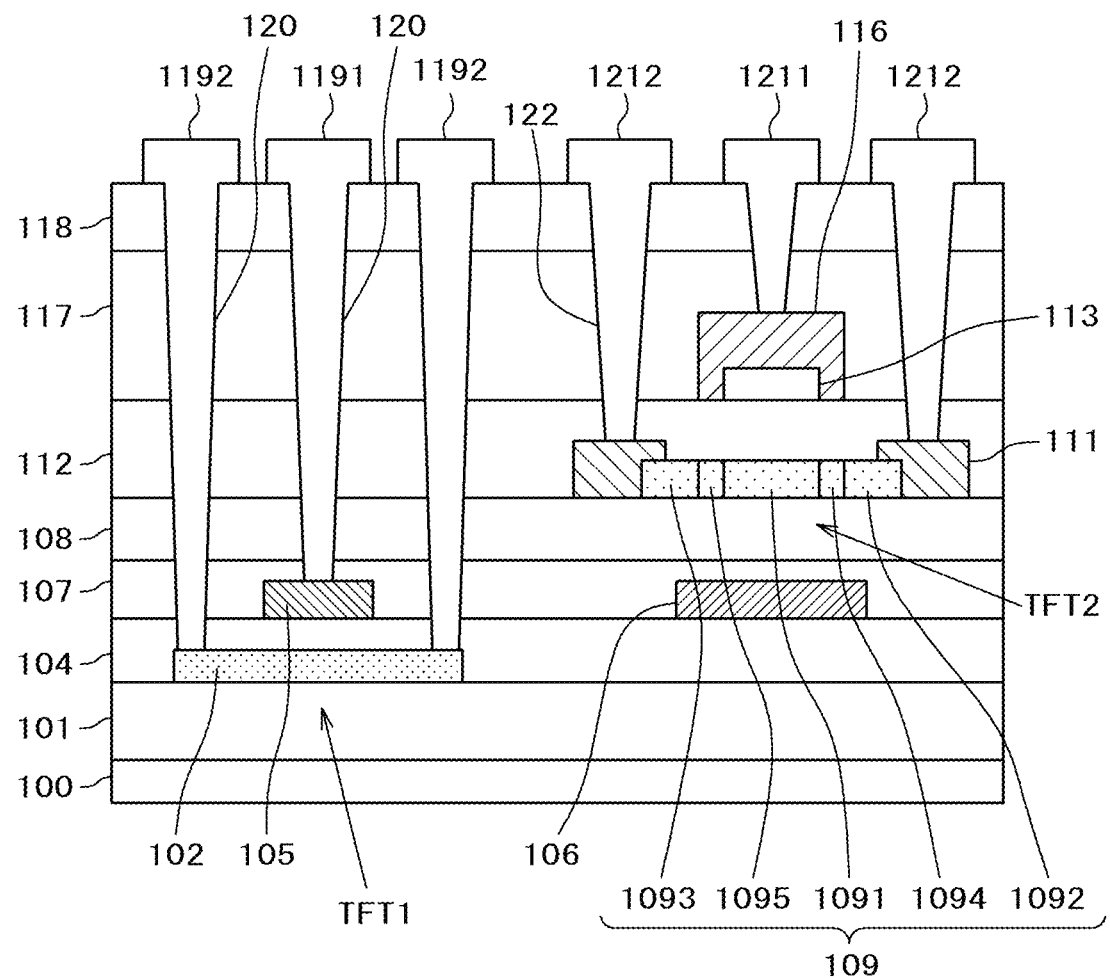
FIG. 4 is a sectional diagram illustrating one example of a configuration of a semiconductor device according to one embodiment of the present invention.

FIG. 4 is a sectional diagram illustrating one example of a configuration of a semiconductor device according to one embodiment of the present invention. The semiconductor device 10 which is illustrated in FIG. 4 is the first substrate which includes a plurality of thin film transistors TFT1, TFT2. In FIG. 4, the left-side thin film transistor (a first thin film transistor) TFT1 is a thin film transistor using LTPS (also called LTPSTFT) and the right-side thin film transistor (a second thin film transistor) TFT2 is a thin film transistor using the oxide semiconductor (OS) (also called OSTFT). The semiconductor device 10 is a semiconductor device which is built in the display panel PNL. The thin film transistor TFT2 has a gate overlapped LDD (Gate Overlapped Lightly Doped Dain: GOLD) structure.

The semiconductor device 10 includes a substrate 100, an underlying film 101, a first semiconductor layer 102, a first gate insulating film 104, a first gate electrode 105, a light shielding layer 106, a first insulating film 107, a second insulating film 108, a second semiconductor layer 109, a second gate insulating film 112, an aluminum oxide film (an AlO film) 113, a second gate electrode 116, a third insulating film 117, a fourth insulating film 118 and so forth. As will be described later, the AlO film 113 is utilized for making resistance of a channel region of the oxide semiconductor high.

In FIG. 4, the underlying film 101 is formed on the substrate 100 which is made of glass or resin. The underlying film 101 is adapted to block intrusion of impurities from the glass and so forth and, in general, is made of a silicon oxide SiO, a silicon nitrite SiN or the like which is obtained by performing CVD (Chemical Vapor Deposition). Incidentally, in the present specification, a notation such as AB (an example: SiO) and so forth indicates that the AB is a compound which contains each of A and B as a constituent element and does not mean that A and B are equal to each other in composition ratio.

The first semiconductor layer 102 which is prepared for the LTPSTFT is formed on the underlying film 101. The first semiconductor layer 102 is made of LTPS. The first gate insulating film 104 is formed so as to cover the first semiconductor layer 102. It is possible to form the first semiconductor layer 102 by, for example, forming amorphous silicon (a-Si), then performing annealing for dehydrogenation, then converting the a-Si into polycrystalline silicon (Poly-Si) by irradiation with excimer laser, and then patterning Poly-Si. It is possible to form the first gate insulating film 104 using SiO which uses TEOS (Tetraethyl orthosilicate) as a raw material.

The first gate electrode 105 and the light shielding layer 106 are formed on the first gate insulating film 104. Each of the first gate electrode 105 and the light shielding layer 106 is formed as a laminated film of a Ti—Al alloy-Ti structure and so forth or is made of a Mo—W alloy and so forth. The light shielding layer 106 is used for light shielding so as to avoid irradiation of a channel region 1091 of OSFTF with light which is emitted from the backlight 202.

The first insulating film 107 is formed so as to cover the first gate electrode 105, the light shielding layer 106 and the first gate insulating film 104. The first insulating film 107 is made of SiN which is obtained by performing the CVD. The second insulating film 108 is formed on the first insulating film 107. The second insulating film 108 is made of SiO which is obtained by performing the CVD.

The second semiconductor layer 109 which is prepared for the OSTFT is formed on the second insulating film 108. The second semiconductor layer 109 is made of OS. The second semiconductor layer 109 includes the channel region 1091, a drain region or source region 1092, a source region or drain region 1093, and low concentration regions 1094 and 1095 (incidentally, in the following, description will be made with the drain region or source region 1092 being defined as the drain region and with the source region or drain region 1093 being defined as the source region). The drain region 1092 and the source region 1093 are set high in impurity concentration in comparison with the low concentration regions 1094 and 1095. In other words, the low concentration regions 1094 and 1095 are lower than the drain region 1092 and the source region 1093 in impurity concentration. The channel region 1091 is located between the low concentration regions 1094 and 1095. The low concentration region 1094 is located between the channel region 1091 and the drain region 1092. The low concentration region 1095 is located between the channel region 1091 and the source region 1093. Accordingly, the thin film transistor TFT2 is located above the thin film transistor TFT1 in a case of viewing from the substrate 100 side.

Metal layers 111 for protection are located on one end and the other end of the second semiconductor layer 109. That is, the metal layers 111 are connected to one end of the drain region 1092 which is not in contact with the low concentration region 1094 and to one end of the drain region 1093 which is not in contact with the low concentration region 1095 respectively. The metal layers 111 are made of, for example, titanium (Ti).

The second gate insulating film 112 is formed so as to cover the second insulating film 108, the second semiconductor layer 109 and the metal layers 111. It is possible to make the second gate insulating film 112 of SiO which is obtained by performing the CVD using $SiH_4$ (silane) and $N_2O$ (nitrous oxide).

The aluminum oxide film (hereinafter, represented by AlO) 113 is formed on the second gate insulating film 112 which is located on the channel region 1091. The second gate electrode 116 is formed on the AlO film 113 in contact with the left and right sides of the AlO film 113 so as to cover the AlO film 113. Accordingly, the AlO film 113 is selectively located on the lower side of the second gate electrode 116. In addition, the AlO film 113 and the second gate electrode 116 are located in the form of an island in a case where the entire of the semiconductor device 10 is observed in a planar view. The second gate electrode 116 is formed, for example, as the laminated film of the Ti—Al alloy-Ti structure and so forth or is made of Mo, the Mo—W alloy and so forth. The second gate electrode 116 which is located on the AlO film 113 in contact with the left and right sides of the AlO film 113 is located above the low concentration regions 1094 and 1095. That is, the OSTFT is configured to have the GOLD structure.

The third insulating film 117 is formed so as to cover the second gate insulating film 112 and the second gate electrode 116. The third gate insulating film 117 is made of SiN.

The fourth insulating film 118 is formed on the third insulating film 117. The fourth insulating film 118 is made of SiO.

Then, contact holes 120 in which a gate electrode wiring 1191 and a source/drain electrode wiring 1192 are to be formed are formed in the LTPSTFT and contact holes 122 in which a gate electrode wiring 1211 and a source/drain electrode wiring 1212 are to be formed are formed in the OSTFT. The contact holes 120 and 122 are formed by dry etching which is performed by using, for example, CF-based (for example, $CF_4$ (carbon tetrafluoride)) gas or CHF-based (for example, $CHF_3$ (trifluoromethane)) gas. The contact holes 120 are formed through five insulating films and six insulating film on the LTPSTFT side and the contact holes 122 are formed through two insulating films and three insulating films on the OSTFT side. Then, the contact holes 120 and 122 are cleaned with an HF-based cleaning solvent and after cleaning, the gate electrode wiring 1191, the source/drain electrode wiring 1192, the gate electrode wiring 1211, and the source/drain electrode wiring 1212 are formed in the contact holes 120 and 122. Incidentally, in the present specification, a source electrode wiring and a drain electrode wiring are combined so as to configure the source/drain electrode wiring (1192 and 1212). It is possible to form each of the gate electrode wirings 1191 and 1211 and the source/drain electrode wirings 1192 and 1212 as the laminated film of, for example, the Ti—Al alloy-Ti structure and so forth.

As illustrated in FIG. 4, the contact holes 120 are formed through five insulating films (118, 117, 112, 108 and 107) and six insulating films (118, 117, 112, 108, 107 and 104) on the LTPSTFT side and, on the other hand, the contact holes 122 are formed through two insulating films (118 and 117) and three insulating films (118, 117, and 112) on the OSTFT side. Accordingly, it is necessary to adjust an etching condition for contact hole formation to the etching condition on the LTPSTFT side. That is, although the OSTFT side is exposed to the etching gas and the cleaning solvent for a longer period of time, it becomes possible to avoid disappearance of the second semiconductor layer 109 by locating the metal layers 111 for protection and thereby to form OSTFT stably.

Since the AlO film 113 is formed in the channel region 1091 of the second semiconductor layer 109 in this way, the second semiconductor layer 109 is made high in resistance with the aid of sufficient oxygen. The low concentration regions 1094 and 1095 are located under the second gate electrode 116 which is located on the AlO film 113 in contact with the left and right sides of the AlO film 113. Accordingly, even in a case where a gate length of OSTFT is short, it is possible to prevent drain deterioration due to presence of the high drain electric field.

(Method of Manufacturing Thin Film Transistor)

Respective manufacturing steps for realizing the semiconductor device 10 which is described in FIG. 4 will be described by using FIG. 5 to FIG. 16.

Figure 5:
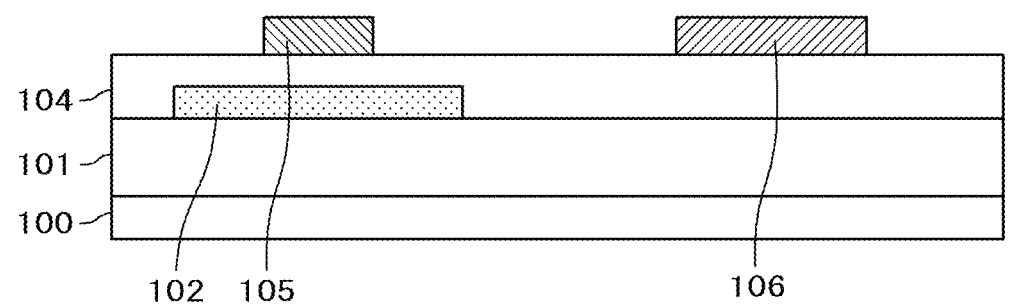
FIG. 5 is a sectional diagram illustrating one example of a state where a first gate electrode is formed.

FIG. 5 is a sectional diagram illustrating one example of a state where the underlying film 101 is formed on the insulating substrate 100, the first semiconductor layer 102 is formed on the underlying film 101, the first gate insulating film 104 is formed so as to cover the first semiconductor layer 102, and the first gate electrode 105 and the light shielding layer 106 are formed on the first gate insulating film 104. After formation of the first gate electrode 105, B (boron) or P (phosphorous) ions are doped into the first semiconductor layer 102 by ion implantation by using the first gate electrode 105 as a mask. Thereby, P-type or N-type electroconductivity is imparted to part of the first semiconductor layer 102 other than part which is covered with the first gate electrode 105 so as to form the drain region and the source region in the first semiconductor layer 102.

Figure 6:
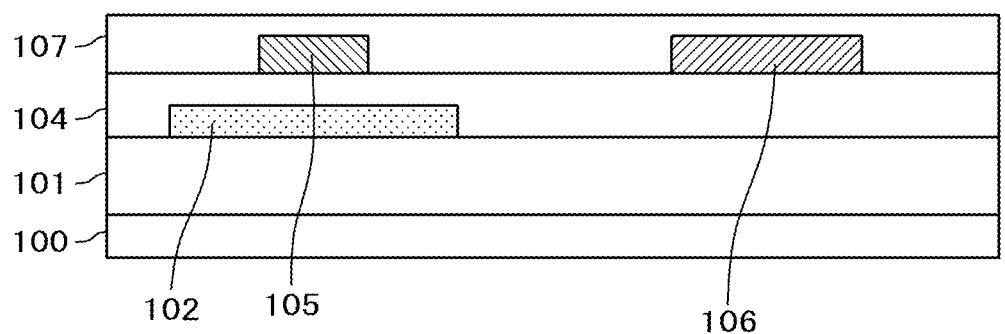
FIG. 6 is a sectional diagram illustrating one example of a state where a first gate insulating film is formed.

FIG. 6 is a sectional diagram illustrating one example of a state where the first insulating film 107 is formed so as to cover the first gate electrode 105, the light shielding layer 106 and the first gate insulating film 104. The first insulating film 107 is made of SiN which is obtained by performing the CVD.

Figure 7:
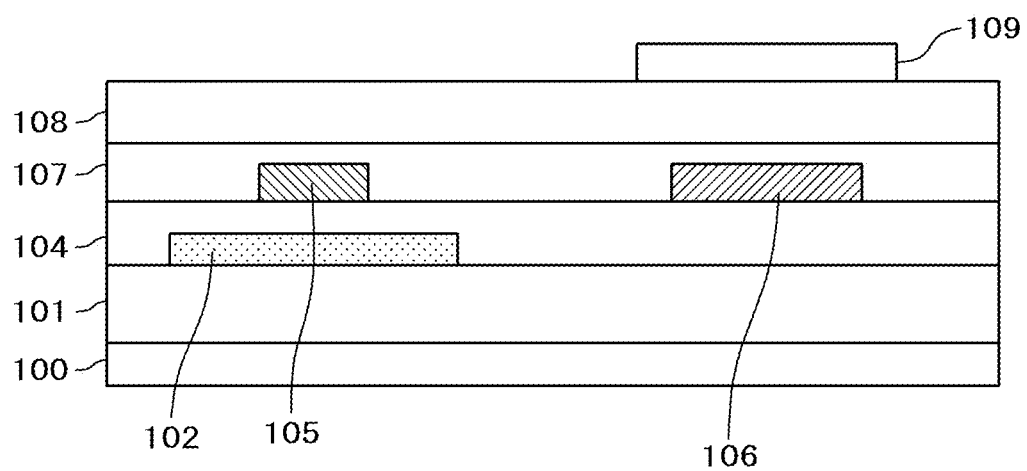
FIG. 7 is a sectional diagram illustrating one example of a state where a second semiconductor layer is formed.

FIG. 7 is a sectional diagram illustrating one example of a state where the second insulating film 108 is formed on the first insulating film 107 and the second semiconductor layer 109 is selectively formed on the second insulating film 108. The second insulating film 108 is made of SiO which is obtained by performing the CVD. The second semiconductor layer 109 is made of OS. A film thickness of the second semiconductor layer 109 is, for example, about 50 nm.

Figure 8:
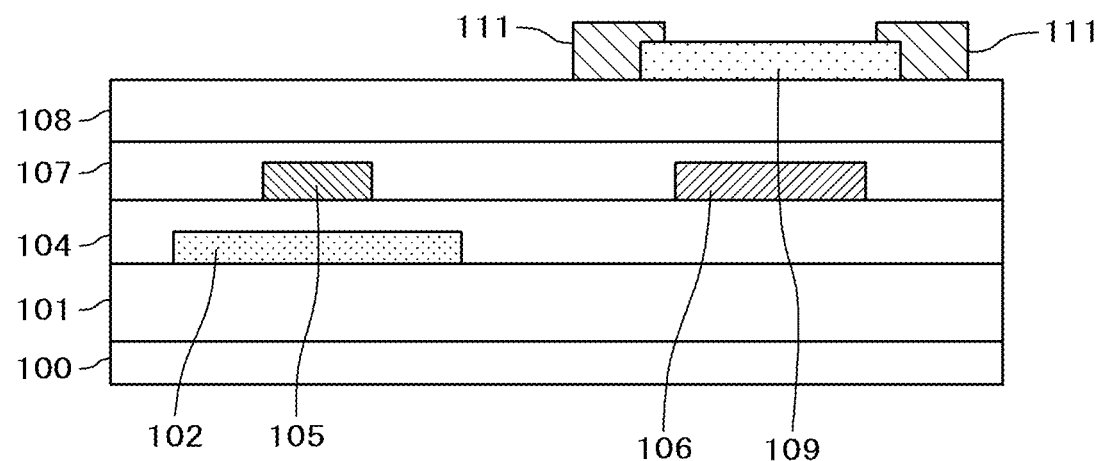
FIG. 8 is a sectional diagram illustrating one example of a state where metal layers for protection are formed.

FIG. 8 is a sectional diagram illustrating one example of a state where the metal layers 111 for protection are selectively formed on the both ends of the second semiconductor layer 109. The metal layers 111 are made of, for example, Ti. As described with reference to FIG. 4, the metal layers 111 are protection films for preventing disappearance of the second semiconductor layer 109 with the etching gas and the cleaning solvent which are used at the time of formation of the contact holes (120 and 122).

Figure 9:
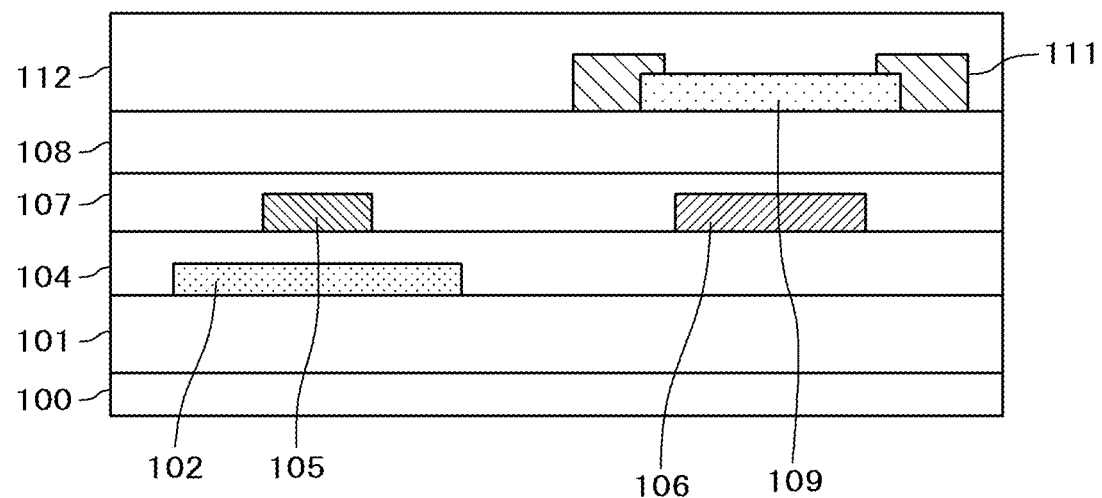
FIG. 9 is a sectional diagram illustrating one example of a state where a second gate insulating film is formed.

FIG. 9 is a sectional diagram illustrating one example of a state where the second gate insulating film 112 is formed so as to cover the second insulating film 108, the second semiconductor layer 109 and the metal layers 111. It is possible to make the second gate insulating film 112 of SiO which is obtained by performing the CVD using $SiH_4$ (silane) and $N_2O$ (nitrous oxide). A film thickness of the second gate insulating film 112 is, for example, about 100 nm.

Figure 10:
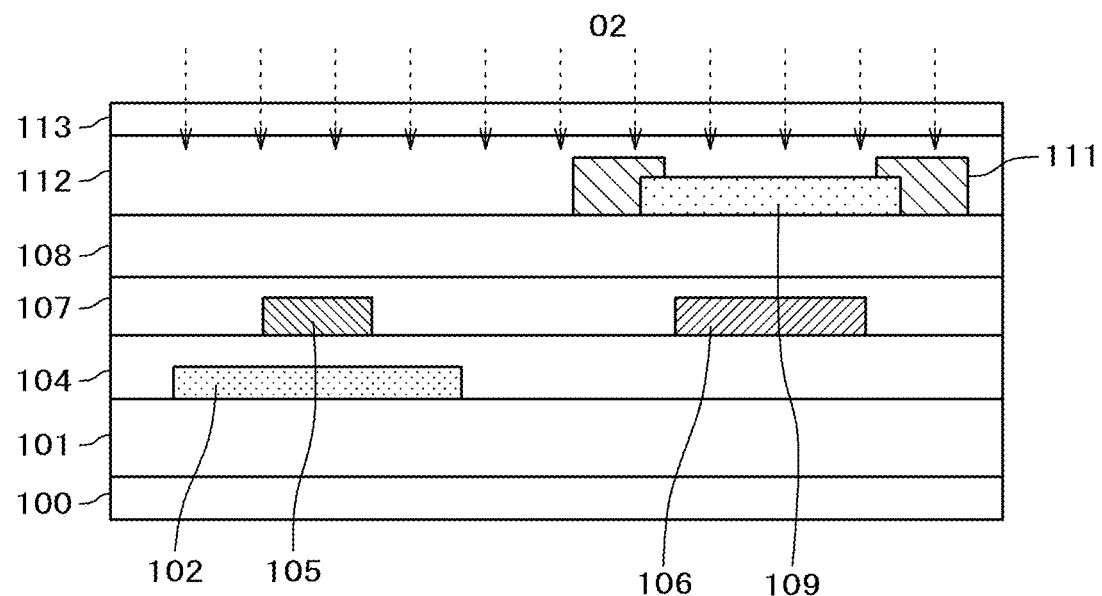
FIG. 10 is a sectional diagram illustrating one example of a state where an aluminum oxide film is formed.

FIG. 10 is a sectional diagram illustrating one example of a state where the AlO film 113 is formed on the second gate insulating film 112. The AlO film 113 is formed by reactive sputtering. A film thickness of the AlO film 113 is, for example, about 5 nm to about 20 nm. The AlO film 113 which is formed by the reactive sputtering contains a large amount of oxygen ($O_2$). The oxygen ($O_2$) is implanted into the second gate insulating film 112. After formation of the AlO film 113, an annealing treatment is performed. The second semiconductor layer 109 is oxidized with the oxygen which is implanted into the second gate insulating film 112 by the annealing treatment and the second semiconductor layer 109 is made high in resistance.

Figure 11:
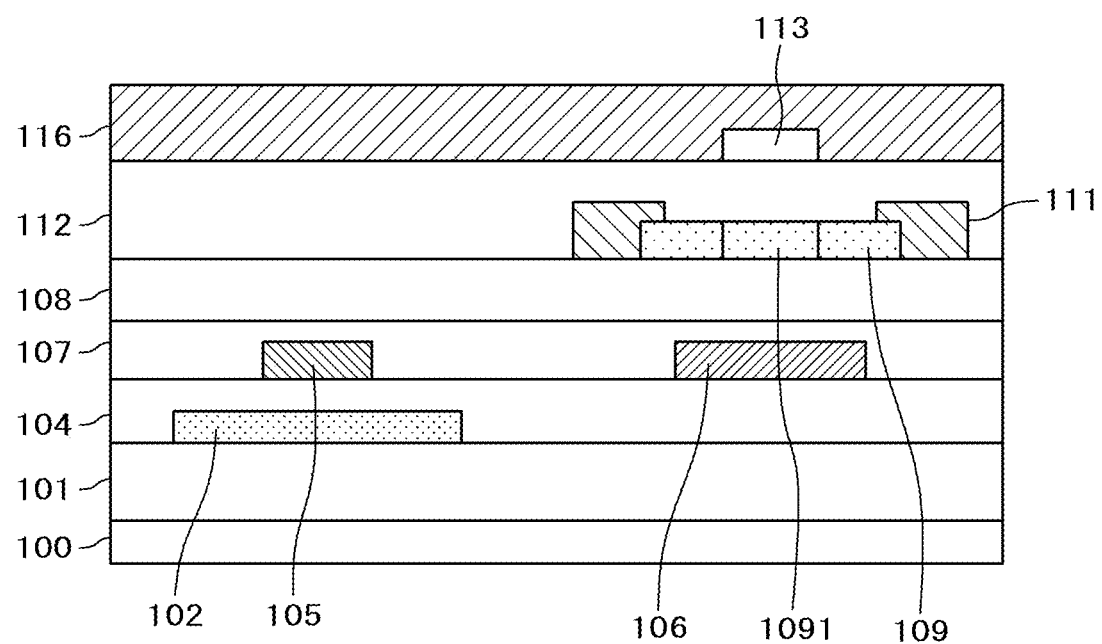
FIG. 11 is a sectional diagram illustrating one example of a state where a second gate electrode is formed.
Figure 12:
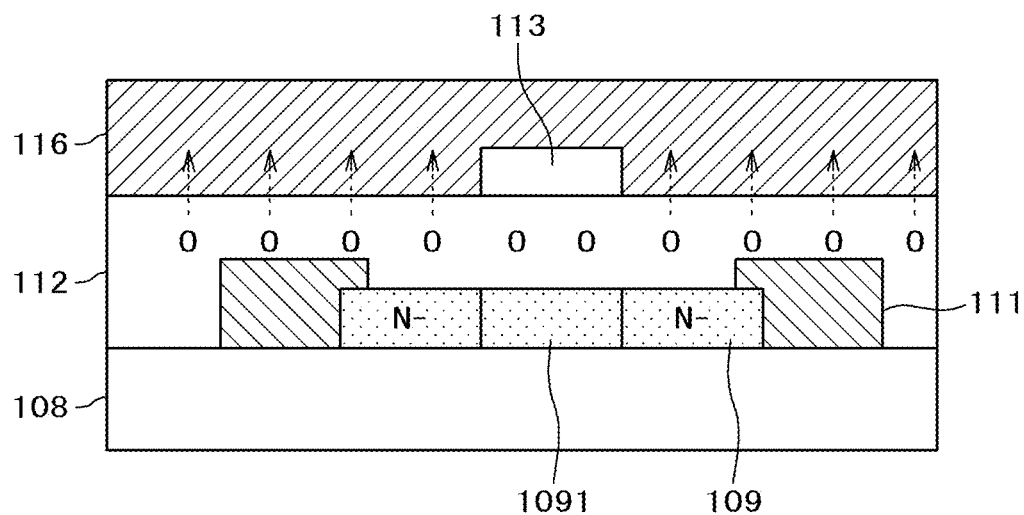
FIG. 12 is an enlarged sectional diagram illustrating one example of essential parts in FIG. 11.

FIG. 11 is a sectional diagram illustrating one example of a state where the second gate electrode 116 is formed on the second gate insulating film 112 and the AlO film 113. FIG. 12 is an enlarged diagram of an OSTFT formation region which is illustrated in FIG. 11. As illustrated in FIG. 11, first, the AlO film 113 is selectively patterned so as to locate above the region (the region which is formed as the channel region 1091 of the OSTFT) of the second semiconductor layer 109. Next, the second gate electrode 116 is formed on the second gate insulating film 112 and the AlO film 113 which is selectively patterned. The second gate electrode 116 is formed, for example, as the laminated film of the Ti—Al alloy-Ti structure and so forth or is made of Ti, Al, Mo, the Mo—W alloy and so forth. A film thickness of the second gate electrode 116 is, for example, about 300 nm. At the time of formation of the second gate electrode 116, the annealing treatment is performed. A temperature for the annealing treatment is, for example, about 350 degrees (° C.).

As illustrated in FIG. 12, in the annealing treatment, since the oxygen (O) which is implanted into the second semiconductor layer 109 and the second gate insulating film 112 is sucked into the second gate electrode 116, the regions of the second semiconductor layer 109 other than the region (the region which is formed as the channel region 1091 of OSTFT) which is located under the AlO film 113 are changed from high resistance states to low resistance (normalized) states. On the other hand, a film thickness of the AlO film 113 is at least 5 nm and therefore the AlO film 113 is capable of playing the part of a prevention layer which prevents suction of oxygen. Accordingly, since in the region (the channel region 1091) of the second semiconductor layer 109 which is located under the AlO film 113, the AlO film 113 plays the part of the prevention layer which prevents suction of oxygen, the high resistance state of the region (the channel region 1091) of the second semiconductor layer 109 is maintained. Incidentally, it is possible to adjust the degree (a resistance value) of low resistiveness (normalization) of each region of the second semiconductor layer 109 by controlling the temperature of the annealing treatment.

Figure 13:
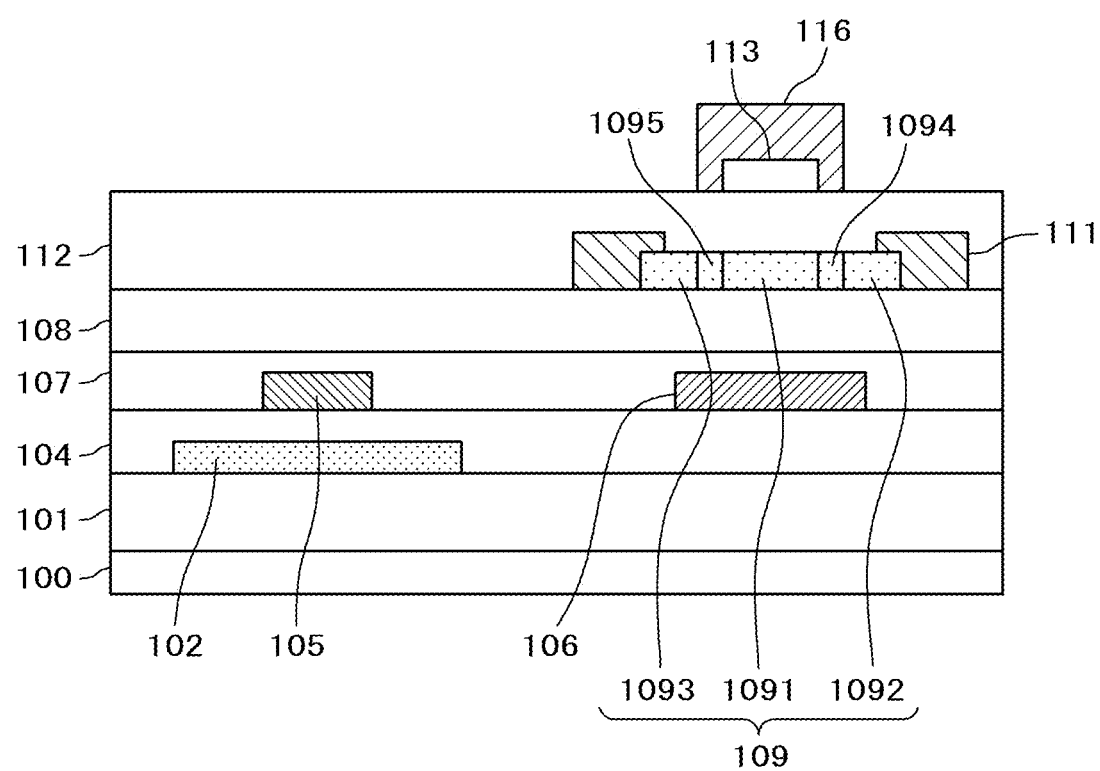
FIG. 13 is a sectional diagram illustrating one example of a state where the second gate electrode is patterned.
Figure 14:
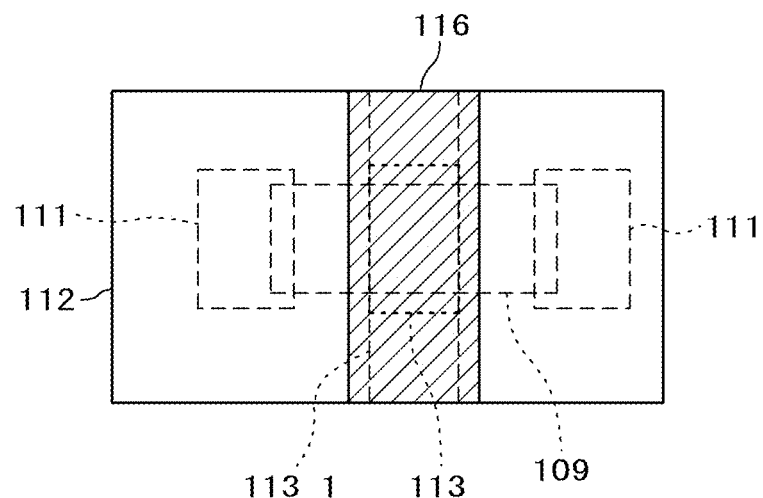
FIG. 14 is a plan view illustrating one example of a case where the state which is illustrated in FIG. 13 is viewed from above.
Figure 15:
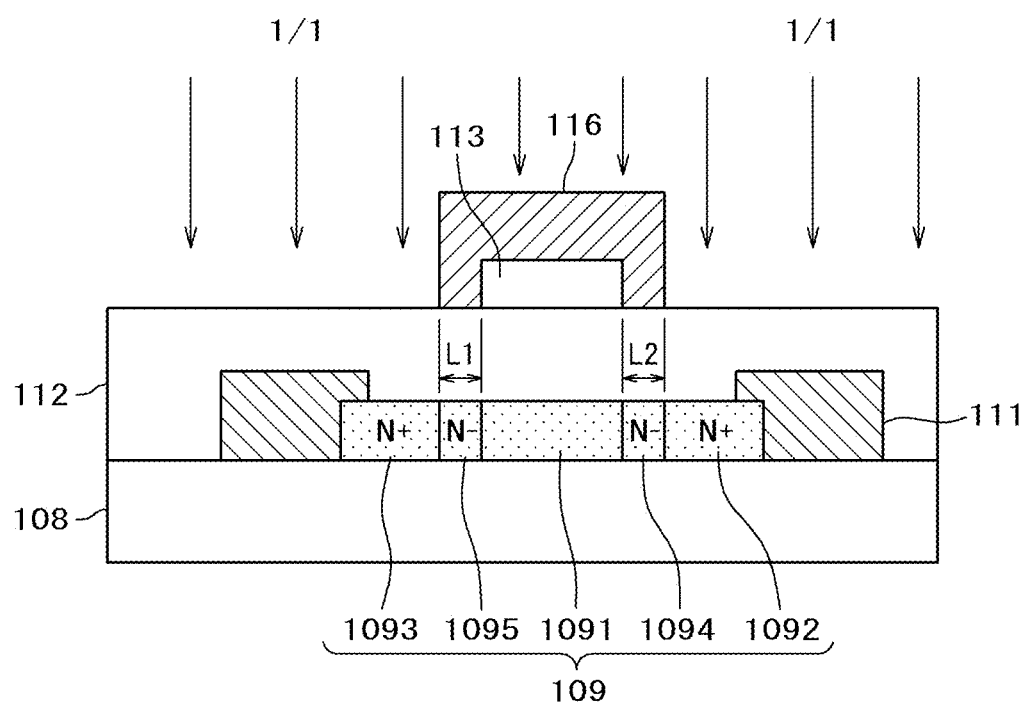
FIG. 15 is an enlarged diagram illustrating one example of an OSTFT formed region for explanation of ion implantation.

FIG. 13 is a sectional diagram illustrating one example of a state where the second gate electrode 116 is selectively patterned. FIG. 14 is a plan view illustrating one example of a case where the state which is illustrated in FIG. 13 is viewed from above. FIG. 15 is an enlarged diagram illustrating one example of the OSTFT formation region used for explanation of ion implantation.

As illustrated in FIG. 13, the second gate electrode 116 is selectively patterned so as to cover the AlO film 113. The second gate electrode 116 is selectively patterned so as to cover over the channel region (1091) of the second semiconductor layer 109 and the regions (the regions which are formed as the low concentration regions 1094 and 1095) on the left and right sides of the channel region (1091). Accordingly, in a case of viewing the semiconductor device 10 in the planar view as a whole, the AlO film 113 and the second gate electrode 116 are located in the form of the island. In FIG. 14, it is possible to selectively locate the AlO film 113 so as to cover over the second semiconductor layer 109 as indicated with a thick dotted line. Otherwise, the AlO film 113 may be selectively located under the second gate electrode 116 so as to extend along the second gate electrode 116 as indicated with a one-point chain line 113_1.

After selective patterning of the second gate electrode 116, ion implantation I/I is performed by using the second gate electrode 116 as the mask and the electroconductivity is imparted to the regions (the regions which are formed as the drain region 1092 and the source region 1093) of the second semiconductor layer 109 other than parts which are covered with the gate electrode 116 as illustrated in FIG. 15. The B (boron) ions, the P (phosphorous) ions, Ar (argon) ions and so forth are used as ions in the ion implantation I/I. The electroconductive drain region 1092 and source region 1093 are formed in the second semiconductor layer 109 by performing the ion implantation I/I. Then, an activation treatment is performed under a hydrogen environment and the resistances of the drain region 1092 and the source region 1093 are made low. Accordingly, it becomes possible to realize the thin film transistor using the oxide semiconductor (OS) which is stabilized in characteristic.

As illustrated in FIG. 15, the low concentration region 1094 is located between the drain region 1092 and the channel region 1091. In addition, the low concentration region 1095 is located between the source region 1093 and the channel region 1091. The drain region 1092 and the source region 1093 are made high in impurity concentration in comparison with the low concentration regions 1094 and 1095 and are made low in resistance. The second gate electrode 116 which is located on the AlO film 113 in contact with the left and right sides of the AlO film 113 is located above the low concentration regions 1094 and the 1095. That is, the OSTFT is configured to have the GOLD structure. Accordingly, even in a case where the gate length of the OSTFT is short, it is possible to prevent the drain deterioration due to presence of the high drain electric field.

It is possible to control with ease widths L1 and L2 of the low concentration regions 1094 and 1095 by adjusting processed dimensions of a width of the AlO film 113 and a width of the second gate electrode 116 which is located on the AlO film 113 in contact with the left and right sides of the AlO film 113. In addition, as described with reference to FIG. 12, it is possible to control with ease the resistance values of the low concentration regions 1094 and 1095 by controlling the temperature of the annealing treatment which is performed at the time of formation of the second gate electrode 116.

Figure 16:
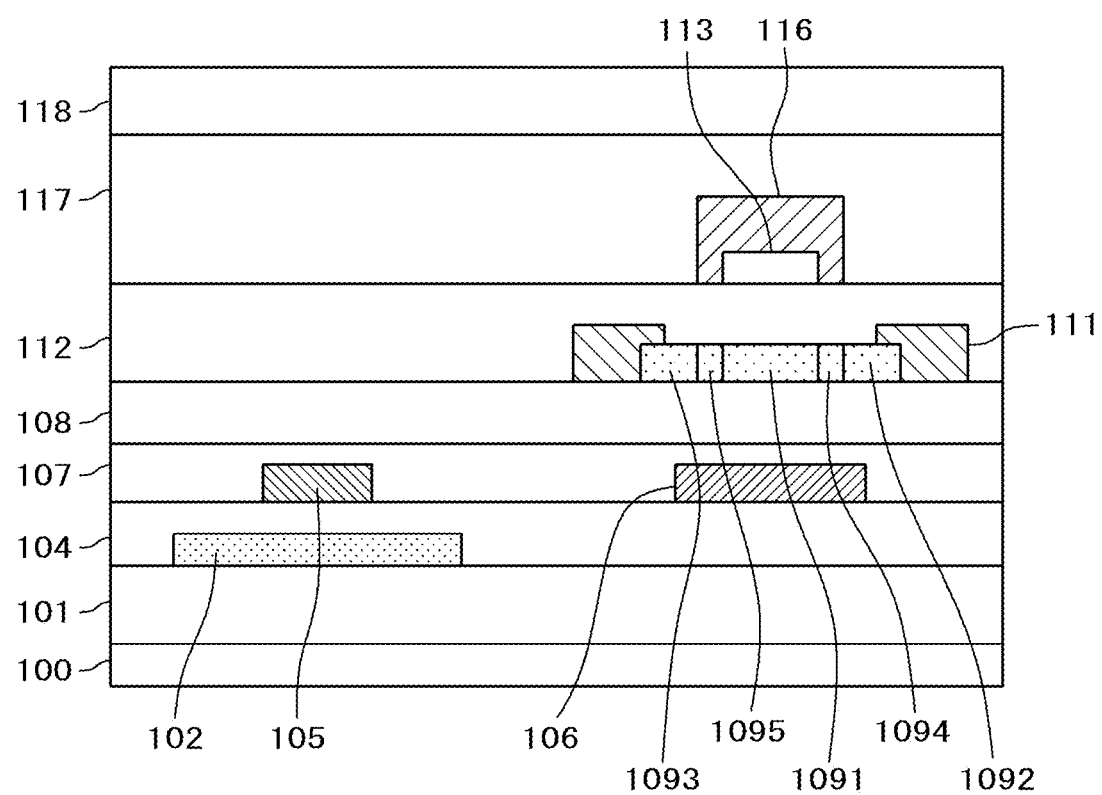
FIG. 16 is a sectional diagram illustrating one example of a state where a fourth insulating film is formed.

FIG. 16 is a sectional diagram illustrating one example of s state where the third insulating film 117 is formed so as to cover the second gate insulating film 112 and the second gate electrode 116 and the fourth insulating film 118 is formed on the third insulating film 117. The third insulating film 117 is made of SiN which is obtained by performing the CVD. The fourth insulating film 118 is made of SiO which is obtained by performing the CVD.

Figure 17:
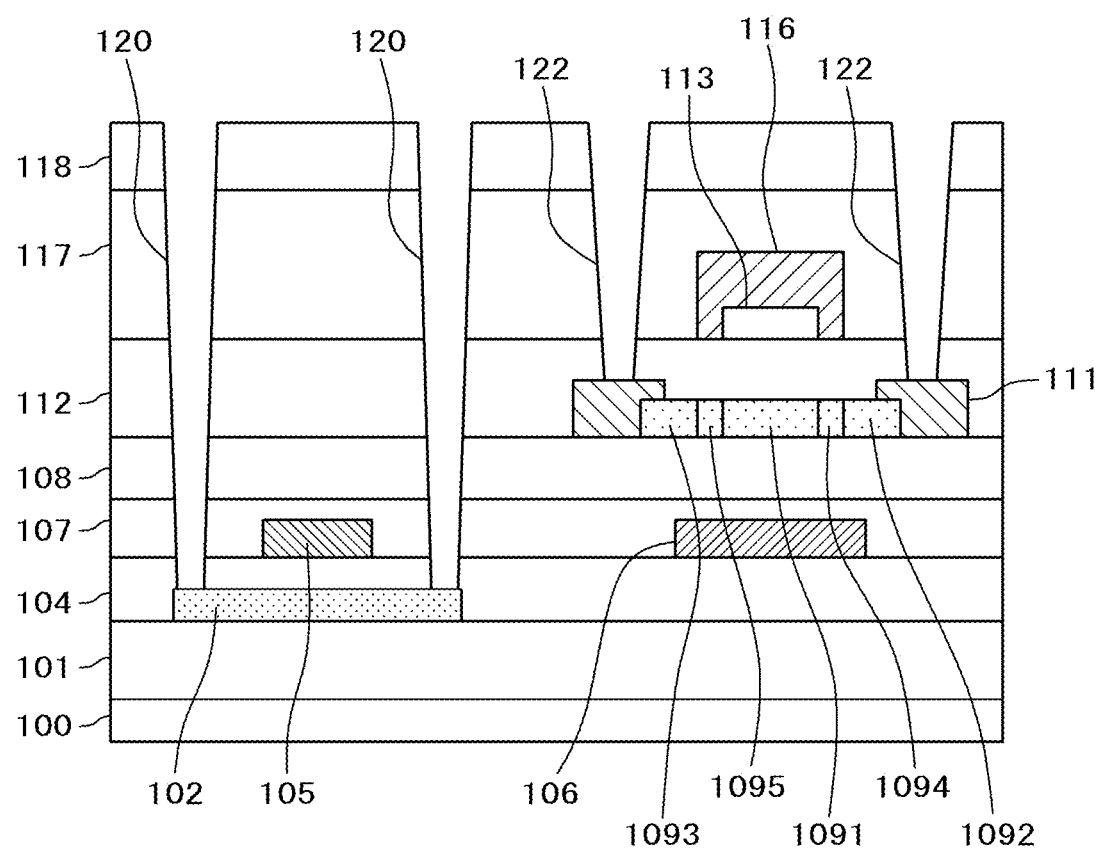
FIG. 17 is a sectional diagram illustrating one example of a state where contact holes are formed.

FIG. 17 is a sectional diagram illustrating one example of a state where the contact holes 120 and 122 are formed. The contact holes 120 and 122 are formed by, for example, dry etching using the CF-based (for example, $CF_4$) gas or the CHF-based (for example, $CHF_3$) gas. It is possible to form the contact holes 120 and 122 simultaneously. The contact holes 120 are formed through six insulating films (118, 117, 112, 108, 107, and 104) such that the drain region and the source region of the semiconductor layer 102 are exposed on the LTPSTFT side. The contact holes 122 are formed through three insulating films (118, 117, and 112) such that the metal layers 111 are exposed on the OSTFT side. Then, the contact holes 120 and 122 are cleaned with the HF-based cleaning solvent.

Figure 18:
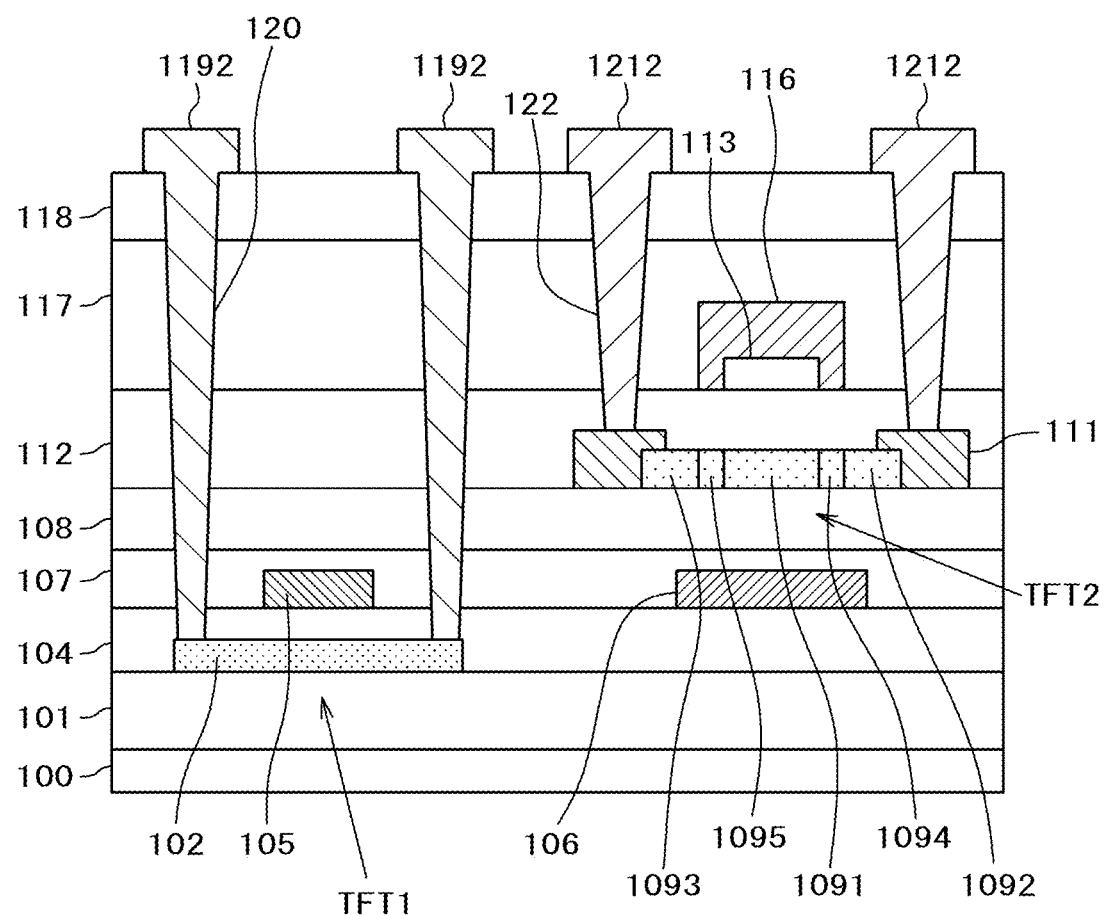
FIG. 18 is a sectional diagram illustrating one example of a state where gate electrode wirings and source/drain electrode wirings are formed.

FIG. 18 is a sectional diagram illustrating one example of a state where the source/drain electrode wirings 1192 and 1212 are formed in the contact holes 120 and 122. After cleaning the contact holes 120 and 122, the source/drain electrode wirings 1192 and 1212 are formed in the contact holes 120 and 122. That is, the source/drain electrode wirings 1192 are formed in the contact holes 120 on the LTPSTFT side. The source/drain electrode wirings 1212 are formed in the contact holes 122 on the OSTFT side.

Incidentally, although the gate electrode wirings 1191 and 1211 which are illustrated in FIG. 4 are not illustrated in FIG. 17 and FIG. 18, the gate electrode wirings 1191 and 1211 may be formed in the contact holes 120 and 122 as has been described with reference to FIG. 4. In this case, the contact hole 120 is formed through five insulating films (118, 117, 112, 108, and 107) such that the first gate electrode 105 is exposed and the gate electrode wiring 1191 is formed in the contact hole 120 on the LTPSTFT side. In addition, the contact hole 122 is formed through two insulating films (118 and 117) such that the second gate electrode 116 is exposed and the gate electrode wiring 1211 is formed in the contact hole 122 on the OSTFT side. Thereby, it becomes possible to form the configuration which is the same as the configuration in the sectional diagram of the semiconductor device 10 which is illustrated in FIG. 4.

According to the present embodiment, it becomes possible to obtain one or a plurality of effects which are described in the following.

1) Since the low concentration regions 1094 and 1095 are formed by utilizing suction of oxygen into the second gate electrode 116 in the annealing treatment, it is possible to form the OSTFT having the GOLD structure without increasing the number of times of performing the ion implantation I/I.
2) It is possible to control with ease the widths L1 and L2 of the low concentration regions 1094 and 1095 by adjusting the processed dimensions of the width of the AlO film 113 and the width of the second gate electrode 116 which is located on the AlO film 113 in contact with the left and right side of the AlO film 113.
3) It is possible to control with ease the resistance values of the low concentration regions 1094 and 1095 by controlling the temperature of the annealing treatment which is performed at the time of formation of the second gate electrode 116.
4) Since the OSTFT has the GOLD structure, even in a case where the gate length of OSTFT is short, it is possible to prevent the drain deterioration due to presence of the high drain electric field.

Modified Example

The semiconductor device 10 which has the LTPSTFT and the OSTFT and is used in a display apparatus and so forth is described in the abovementioned embodiment. In the following modified example, a semiconductor device 10a which has only OSTFT and is used in the display apparatus and so forth will be described. In this case, in the configuration of OSTFT which is illustrated in FIG. 4, it is possible to eliminate the metal layers 111 for protection which are connected to the drain region 1092 and the source region 1093. Accordingly, since it is possible to eliminate the film deposition step and the patterning step for the metal layers 111 and the contact hole cleaning step, it becomes possible to reduce the number of manufacturing steps.

Figure 21:
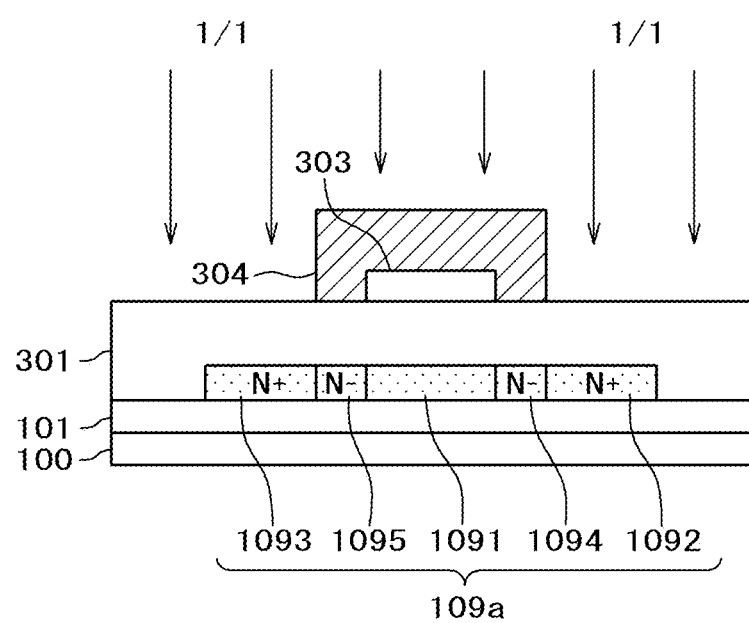
FIG. 21 is a sectional diagram illustrating one example of a state where the gate electrode is patterned in the modified example.
Figure 22:
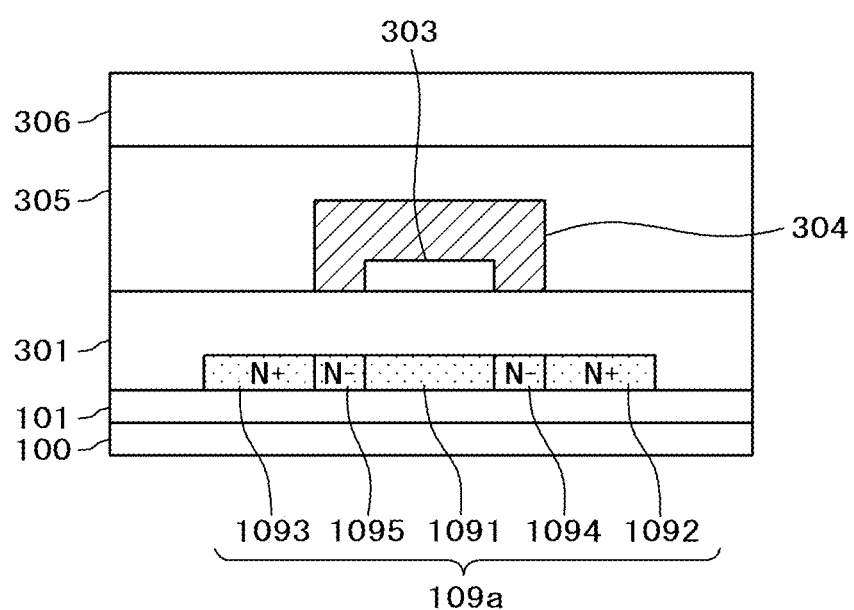
FIG. 22 is a sectional diagram illustrating one example of a state where a second insulating film is formed in the modified example.
Figure 23:
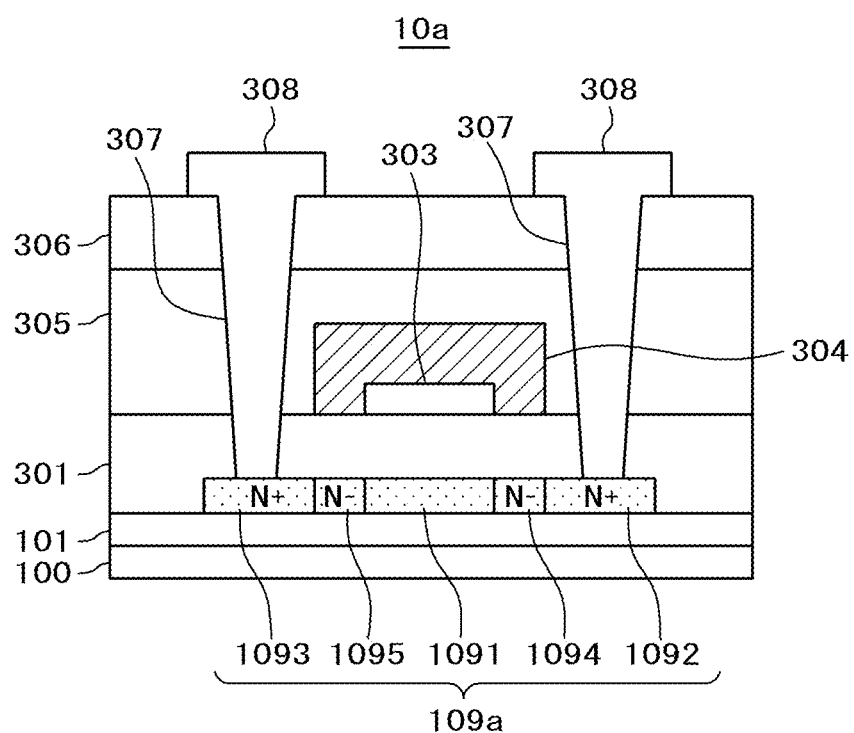
FIG. 23 is a sectional diagram illustrating one example of a state where source/drain electrode wirings are formed in the modified example.

FIG. 19 to FIG. 23 are sectional diagrams illustrating examples of the respective manufacturing steps of the semiconductor device 10a according to the modified example respectively. As illustrated in FIG. 23, the semiconductor device 10a is a first substrate which includes a thin film transistor TFT2 (OSTFT) using the oxide semiconductor (OS). The semiconductor device 10a is a semiconductor device which is built in the display panel PNL in FIG. 1. In the following, the steps of manufacturing the semiconductor device 10a according to the modified example will be described by using FIG. 19 to FIG. 23.

Figure 19:
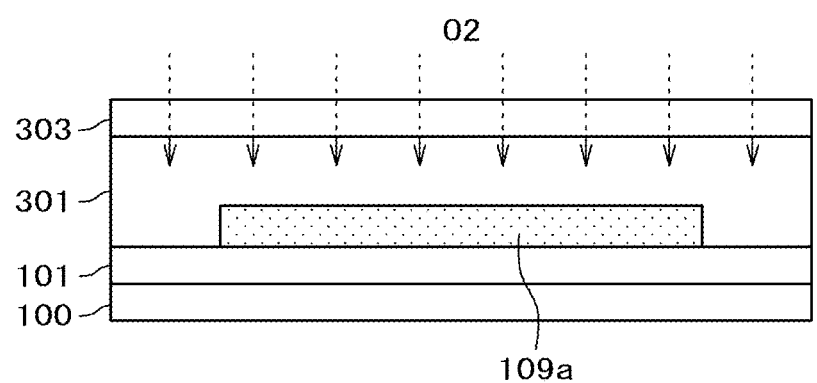
FIG. 19 is a sectional diagram illustrating one example of a state where an AlO (aluminum oxide) film is formed in a semiconductor device according to a modified example of the present invention.

FIG. 19 is a sectional diagram illustrating one example of a state where the underlying film 101 is formed on the insulating substrate 100, a semiconductor layer 109a is formed on the underlying film 101, a gate insulating film 301 is formed so as to cover the underlying film 101 and the semiconductor layer 109a and an AlO film 303 is formed on the gate insulating film 301.

The substrate 100 is made of glass or resin. The underlying film 101 is made of the silicone oxide SiO, the silicon nitride SiN or the like which is obtained by performing the CVD. The semiconductor layer 109a is made of the OS. It is possible to make the gate insulating film 301 of SiO which is obtained by performing the CVD using $SiH_4$ (silane) and $N_2O$ (nitrous oxide). A film thickness of the semiconductor layer 109a is, for example, about 50 nm. A film thickness of the gate insulating film 301 is, for example, about 100 nm. A film thickness of the AlO film 303 is, for example, about 5 nm to about 20 nm.

Similarly to the case which is described in the embodiment, the AlO film 303 is formed by the reactive sputtering. The AlO film 303 which is formed by the reactive sputtering contains a large amount of oxygen ($O_2$). The oxygen ($O_2$) is implanted into the gate insulating film 301. After formation of the AlO film 303, the annealing treatment is performed. The semiconductor layer 109a is oxidized with the oxygen which is implanted into the gate insulating film 301 by the annealing treatment and the semiconductor layer 109a is made high in resistance.

Figure 20:
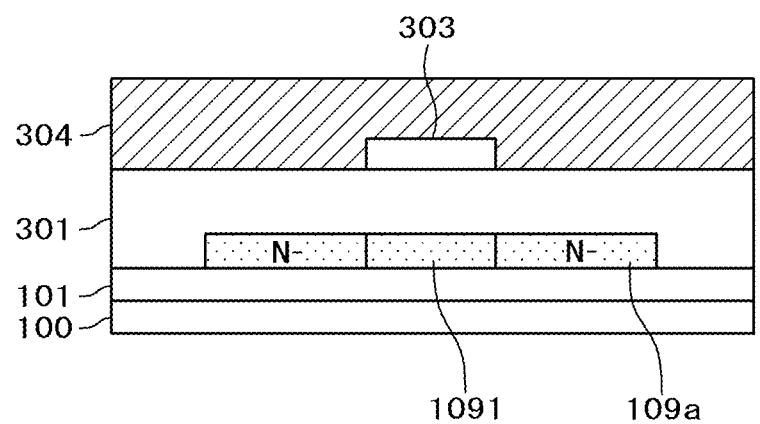
FIG. 20 is a sectional diagram illustrating one example of a state where a gate electrode is formed in the modified example.

FIG. 20 is a sectional diagram illustrating one example of a state where a gate electrode 304 is formed on the gate insulating film 301 and the selectively patterned AlO film 303. As illustrated in FIG. 20, first, the AlO film 303 is selectively patterned so as to locate above the region (the region which is formed as the channel region 1091 of the OSTFT) of the semiconductor layer 109a. Next, the gate electrode 304 is formed on the gate insulating film 301 and the selectively patterned AlO film 303. The gate electrode 304 is formed as the laminated film of the Ti—Al alloy-Ti structure and so forth or is made of Ti, Al, Mo, the Mo—W alloy and so forth. A film thickness of the gate electrode 394 is, for example, about 300 nm. The annealing treatment is performed at the time of formation of the gate electrode 304. A temperature of the annealing treatment is, for example, about 350 degrees (° C.).

Similarly to the case which is described with reference to FIG. 12, since the gate electrode 304 sucks up the oxygen (O) which is implanted into the semiconductor layer 109a and the gate insulating film 301 in the annealing treatment which is performed at the time of formation of the gate electrode 304, the regions of the semiconductor layer 109a other than the region (the region which is formed as the channel region 1091 of the OSTFT) of the semiconductor layer 109a which are located under the AlO film 303 are changed from high resistance states to low resistance (normalized) states. On the other hand, a film thickness of AlO film 303 is at least about 5 nm and therefore it becomes possible for the AlO film 303 to play the part of the prevention layer which prevents suction of the oxygen. Accordingly, since the AlO film 303 plays the part of the prevention layer which prevents suction of the oxygen in the region (the channel region 1091) of the semiconductor layer 109a which is located under the AlO film 303, the high resistance state of the region (the channel region 1091) of the semiconductor layer 109a is maintained. Incidentally, it is possible to adjust the degree (the resistance value) of the low resistiveness (normalization) of the regions of the semiconductor layer 109a by controlling the temperature of the annealing treatment.

FIG. 21 is a sectional diagram illustrating one example of a state where the gate electrode 304 is selectively patterned. As illustrated in FIG. 21, the gate electrode 304 is selectively patterned so as to cover the AlO film 303. The gate electrode 304 is selectively pattered so as to cover over the channel region 1091 of the semiconductor layer 109a and the regions (the regions which are formed as the low concentration regions 1094 and 1095) which are located on the left and right sides of the channel region 1091. In a case where the semiconductor device 10a is observed in the planar view as a whole, the AlO film 303 and the gate electrode 304 are located in the form of an island.

In FIG. 21, the ion implantation I/I is performed by using the gate electrode 304 as the mask and the electroconductivity is imparted to the regions (the regions which are formed as the drain region 1092 and the source region 1093) of the semiconductor layer 109a other than the parts which are covered with the gate electrode 304. The B (boron) ions, the P (phosphorous) ions, the Ar (argon) ions and so forth are used as the ions in the ion implantation I/I. The electroconductive drain region 1092 and source region 1093 are formed in the semiconductor layer 109a by performing the ion implantation I/I. Then, the activation treatment is performed under the hydrogen environment and the drain region 1092 and the source region 1093 are made low in resistance (normalized). Accordingly, it becomes possible to realize the thin film transistor using the oxide semiconductor (OS) which is stabilized in characteristic.

As illustrated in FIG. 21, the low concentration region 1094 is located between the drain region 1092 and the channel region 1091. In addition, the low concentration region 1095 is located between the source region 1093 and the channel region 1091. The drain region 1092 and the source region 1093 are made high in impurity concentration in comparison with the low concentration regions 1094 and 1095 and are made low in resistance. The second gate electrode 304 which is located on the AlO film 303 in contact with the left and right sides of the AlO film 303 is located above the low concentration regions 1094 and 1095. That is, the OSTFT is configured to have the GOLD structure. Accordingly, even in a case where the gate length of the OSTFT is short, it is possible to prevent the drain deterioration due to the presence of the high drain electric field.

Similarly to the case which is described with reference to FIG. 15, it is possible to control with ease the widths of the low concentration regions 1094 and 1095 by adjusting processed dimensions of a width of the AlO film 303 and a width of the gate electrode 303 which is located on the AlO film 303 in contact with the left and right sides of the AlO film 303. In addition, similarly to the case which is described with reference to FIG. 12, it is possible to control with ease the resistance values of the low concentration regions 1094 and 1095 by controlling the temperature of the annealing treatment which is performed at the time of formation of the gate electrode 304.

FIG. 22 is a sectional diagram illustrating one example of a state where a first insulating film 305 is formed so as to cover the gate insulating film 301, the selectively patterned AlO film 303, and the gate electrode 304, and a second insulating film 306 is formed on the first insulating film 305. The first insulating film 305 is made of SiN which is obtained by performing the CVD. The second insulating film 306 is made of SiO which is obtained by performing the CVD.

FIG. 23 is a sectional diagram illustrating one example of a state where source/drain electrode wirings 308 are formed in contact holes 307. The contact holes 307 are formed by, for example, the dry etching using the CF-based (for example, $CF_4$) gas or the CHF-based (for example, $CHF_3$) gas. The contact holes 307 are formed through three insulating films (306, 305, and 301) in such a manner that the drain region 1092 and the source region 1093 are exposed. Then, the source/drain electrode wirings 308 are formed in the contact holes 307 respectively. The semiconductor device 10a which includes a thin film transistor TFT2 (OSTTFT) using the oxide semiconductor (OS) is formed in the abovementioned way.

It is possible to reduce the number of the manufacturing steps by configuring OSTFT having the GOLD structure as described above.

According to the modified example, it becomes possible to obtain one or a plurality of effects which are described in the following.
1) Since the low concentration regions 1094 and 1095 are formed by utilizing suction of oxygen into the gate electrode 304 in the annealing treatment, it is possible to form the OSTFT having the GOLD structure without increasing the number of times of performing the ion implantation I/I.
2) It is possible to control with ease the widths of the low concentration regions 1094 and 1095 by adjusting the processed dimensions of the width of the AlO film 303 and the width of the gate electrode 304 which is located on the AlO film 303 in contact with the left and right sides of the AlO film 303.
3) It is possible to control with ease the resistance values of the low concentration regions 1094 and 1095 by controlling the temperature of the annealing treatment which is performed at the time of formation of the gate electrode 304.
4) Since the OSTFT has the GOLD structure, even in a case where the gate length of OSTFT is short, it is possible to prevent the drain deterioration due to the presence of the high drain electric field.

Also all the display apparatuses that a person skilled in the art would embody by appropriately changing the design on the basis of the display apparatus which is described above as the embodiment of the present invention belong to the scope of the present invention as long as the display apparatuses include the gist of the present invention.

It would be possible for the person skilled in the art to conceive of various altered examples and modified example in the category of the concept of the present invention and it is understood that also those altered examples and modified examples belong to the scope of the present invention. For example, also things and matters that the person skilled in the art obtains by appropriately adding or deleting a constitutional element to or from the abovementioned each embodiment or by changing the design thereof, or by adding or eliminating the step(s) to or from the abovementioned each embodiment or changing the design thereof are included in the scope of the present invention as long as they have the gist of the present invention.

In addition, it is understood that in regard to other operational effects which are brought about by the aspect which is mentioned in the present embodiment, the operational effect which is apparent from the description of the present specification or which is appropriately conceivable for the person skilled in the art is naturally brought about by the present invention.

It is possible to form various inventions by appropriately combining the plurality of constitutional elements which are disclosed in the abovementioned embodiment with one another. For example, some constitutional elements may be deleted from all the constitutional elements which are indicated in the embodiment. Further, constitutional elements which covers different embodiments may be appropriately combined with each other/one another.

What is claimed is:
1. A semiconductor device comprising thin film transistors each having an oxide semiconductor,
   wherein the oxide semiconductor has a channel region, a drain region, a source region, and low concentration regions which are lower in impurity concentration than the drain region and the source region, the low concentration regions being located between the channel region and the drain region, and between the channel region and the source region, and each of the thin film transistors has:

a gate insulating film on the channel region and the low concentration regions;

an aluminum oxide film on a first part of the gate insulating film, the first part being located on the channel region; and a gate electrode on the aluminum oxide film and a second part of the gate insulating film, the second part being located on the low concentration regions, wherein the aluminum oxide film is located between the gate insulating film and the gate electrode, the gate insulating film is formed of a different material from the aluminum oxide film, the aluminum oxide film includes a lower surface, an upper surface, a first side surface and a second side surface, the lower surface of the aluminum oxide film is in direct contact with the gate insulating film, the upper surface of the aluminum oxide film is opposite the lower surface of the aluminum oxide film, the first side surface of the aluminum oxide film is closer to the source region compared to the second side surface of the aluminum oxide film, and the gate electrode covers the upper surface of the aluminum oxide film, the first side surface of the aluminum oxide film and the second side surface of the aluminum oxide film.

2. The semiconductor device according to claim 1, wherein the channel region contains a lot of oxygen in comparison with the low concentration regions, the drain region, and the source region.

3. The semiconductor device according to claim 1, wherein the oxide semiconductor is composed of IGZO.

4. The semiconductor device according to claim 1, further comprising a display panel with pixels, wherein each of the pixels includes corresponding one of the thin film transistors.

5. The semiconductor device according to claim 1, wherein a film thickness of the aluminum oxide film is 5 nm to 20 nm.

6. The semiconductor device according to claim 1, wherein the first side surface of the aluminum oxide film connects the lower surface of the aluminum oxide film to the upper surface of the aluminum oxide film, and the second side surface of the aluminum oxide film connects the lower surface of the aluminum oxide film to the upper surface of the aluminum oxide film.

7. The semiconductor device according to claim 1, wherein the gate electrode is in direct contact with the upper surface of the aluminum oxide film, the first side surface of the aluminum oxide film and the second side surface of the aluminum oxide film.

8. The semiconductor device according to claim 1, wherein the aluminum oxide film is not provided on the second part of the gate insulating film.

9. The semiconductor device according to claim 1, wherein the aluminum oxide film is formed in an island shape in a planar view.

10. The semiconductor device according to claim 1, wherein the gate electrode covers an entirety of the aluminum oxide film in a planar view.

11. A semiconductor device comprising:

a substrate;

a first thin film transistor on the substrate and having polycrystalline silicon; and a second thin film transistor on the substrate and having an oxide semiconductor, wherein the oxide semiconductor has a channel region, a drain region, a source region, and low concentration regions which are lower in impurity concentration than the drain region and the source region, the low concentration regions being located between the channel region and the drain region, and between the channel region and the source region, and the second thin film transistor has:

a gate insulating film on the channel region and the low concentration regions;

an aluminum oxide film on a first part of the gate insulating film, the first part being located on the channel region; and a gate electrode on the aluminum oxide film and a second part of the gate insulating film, the second part being located on the low concentration regions, wherein the aluminum oxide film is located between the gate insulating film and the gate electrode, the gate insulating film is formed of a different material from the aluminum oxide film, the aluminum oxide film includes a lower surface, an upper surface, a first side surface and a second side surface, the lower surface of the aluminum oxide film is in direct contact with the gate insulating film, the upper surface of the aluminum oxide film is opposite the lower surface of the aluminum oxide film, the first side surface of the aluminum oxide film is closer to the source region compared to the second side surface of the aluminum oxide film, and the gate electrode covers the upper surface of the aluminum oxide film, the first side surface of the aluminum oxide film and the second side surface of the aluminum oxide film.

12. The semiconductor device according to claim 11, wherein the channel region contains a lot of oxygen in comparison with the low concentration regions, the drain region, and the source region.

13. The semiconductor device according to claim 11, wherein the oxide semiconductor is composed of IGZO.

14. The semiconductor device according to claim 11, further comprising a display panel including a display area with pixels and a non-display area outside the display area, wherein a drive circuit controlling the pixels is located in the non-display area and includes the first thin film transistor, and each of the pixels includes corresponding one of the thin second film transistors.

15. The semiconductor device according to claim 11, wherein a film thickness of the aluminum oxide film is 5 nm to 20 nm.

16. The semiconductor device according to claim 11, wherein the first side surface of the aluminum oxide film connects the lower surface of the aluminum oxide film to the upper surface of the aluminum oxide film, and the second side surface of the aluminum oxide film connects the lower surface of the aluminum oxide film to the upper surface of the aluminum oxide film.

17. The semiconductor device according to claim 11, wherein the gate electrode is in direct contact with the upper surface of the aluminum oxide film, the first side surface of the aluminum oxide film and the second side surface of the aluminum oxide film.

18. The semiconductor device according to claim 11, wherein the aluminum oxide film is not provided on the second part of the gate insulating film.

19. The semiconductor device according to claim 11, wherein the aluminum oxide film is formed in an island shape in a planar view.

20. The semiconductor device according to claim 11, wherein the gate electrode covers an entirety of the aluminum oxide film in a planar view.

* * * * *